United States Patent
Okuno

(10) Patent No.: US 9,496,453 B2
(45) Date of Patent: Nov. 15, 2016

(54) METHOD FOR PRODUCING GROUP III NITRIDE SEMICONDUCTOR LIGHT-EMITTING DEVICE

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/008,363

(22) Filed: Jan. 27, 2016

(65) Prior Publication Data

US 2016/0247962 A1 Aug. 25, 2016

(30) Foreign Application Priority Data

Feb. 23, 2015 (JP) ................................ 2015-032944

(51) Int. Cl.
*H01L 33/32* (2010.01)
*H01L 33/00* (2010.01)

(52) U.S. Cl.
CPC ................................ *H01L 33/007* (2013.01)

(58) Field of Classification Search
CPC ............................ H01L 33/007; H01L 33/0075
See application file for complete search history.

(56) References Cited

U.S. PATENT DOCUMENTS

| 2010/0252835 | A1* | 10/2010 | Horie | C30B 25/02 257/76 |
| 2014/0087508 | A1* | 3/2014 | Miyazaki | H01L 33/007 438/47 |
| 2016/0020361 | A1* | 1/2016 | Okuno | H01L 33/325 257/102 |

FOREIGN PATENT DOCUMENTS

JP H 08-097471 A 4/1996

* cited by examiner

*Primary Examiner* — Mamadou Diallo
(74) *Attorney, Agent, or Firm* — McGinn IP Law Group, PLLC

(57) ABSTRACT

There is provided a method for producing a Group III nitride semiconductor light-emitting device having a low driving voltage, which is realized by steeply increasing the concentration of Mg within a p-type semiconductor layer. This production method includes the steps of forming an n-type contact layer, forming an n-side high electrostatic breakdown voltage layer, forming an n-side superlattice layer, forming a light-emitting layer, forming a p-type cladding layer, forming a p-type intermediate layer, and forming a p-type contact layer. The step of forming the p-type cladding layer includes supplying a dopant gas without supplying a first raw material gas (TMG) containing a Group III element during a first period TA1 and supplying the first raw material gas (TMG) and the dopant gas during a second period TA2 after the first period TA1 so as to grow a semiconductor layer.

16 Claims, 7 Drawing Sheets

METHOD FOR PRODUCING GROUP III NITRIDE SEMICONDUCTOR LIGHT-EMITTING DEVICE

BACKGROUND OF THE INVENTION

1. Field of the Invention

The technical field of the present specification relates to a method for producing a Group III nitride semiconductor light-emitting device which allows stable doping of a p-type semiconductor layer with Mg.

2. Background Art

One type of Group III nitride semiconductor light-emitting device includes an n-type contact layer, an n-type cladding layer, a light-emitting layer, a p-type cladding layer, a p-type contact layer, an n-electrode, and a p-electrode. Preferably, the p-type contact layer and the p-electrode are in good Ohmic contact with each other. When the contact resistance between the p-type contact layer and the p-electrode is high, the driving voltage is high accordingly.

For example, Patent Document 1 discloses a light-emitting diode 10 including a second contact layer 62, and a first contact layer 63 having a higher Mg concentration than the second contact layer 62 (see paragraph [0011] and FIG. 1 in Patent Document 1). Patent Document 1 describes that the Ohmic contact between the p-type contact layer and the p-electrode is thereby improved, and this allows the light-emitting device obtained to have a low driving voltage (see paragraph [0009] in Patent Document 1).

Patent Document 1: Japanese Patent Application Laid-Open (kokai) No. H08-097471

When the electrical resistance of the p-type cladding layer is high, the driving voltage is high accordingly. Therefore, it is preferable to reduce the electrical resistance of the p-type cladding layer. The p-type cladding layer plays a role in confining electrons within the light-emitting layer. To confine electrons, it is preferable that a p-type impurity is present at a high concentration in the p-type cladding layer. Particularly, it is preferable that the concentration of the p-type impurity is high in the vicinity of the boundary between the light-emitting layer and the p-type cladding layer. However, it is by no means easy to increase the concentration of the p-type impurity steeply within the p-type cladding layer. The steepness of the increase in the p-type impurity concentration may vary among production lots. Therefore, the driving voltage of the light-emitting device may vary greatly among production lots.

It is preferable to increase the concentration of Mg steeply also within a p-type semiconductor layer other than the p-type cladding layer. This is because a semiconductor light-emitting device with a low driving voltage can be realized.

SUMMARY OF THE INVENTION

The technique of the present specification has been conceived to solve the foregoing problems in the prior art. It is therefore an object of the technique of the present specification to provide a method for producing a Group III nitride semiconductor light-emitting device having a low driving voltage, which is realized by steeply increasing the concentration of Mg within a p-type semiconductor layer.

A method for producing a Group III nitride semiconductor light-emitting device according to a first aspect includes the steps of forming an n-type semiconductor layer on a substrate; forming a light-emitting layer on the n-type semiconductor layer; forming a first p-type semiconductor layer on the light-emitting layer; and forming a p-type contact layer on the first p-type semiconductor layer. The step of forming the first p-type semiconductor layer includes supplying a dopant gas during a first period without supplying a first raw material gas containing a Group III element, and supplying the first raw material gas and the dopant gas during a second period after the first period so as to grow a semiconductor layer.

In the method for producing a Group III nitride semiconductor light-emitting device, the p-type dopant gas is supplied prior to the supply of the Group III element-containing first raw material gas before the first p-type semiconductor layer is formed. This increases the concentration of the dopant gas in a furnace of a semiconductor manufacturing apparatus and in the vicinity of the surface of the substrate. Specifically, a sufficient amount of the dopant gas is present around the substrate immediately before the formation of the first p-type semiconductor layer. Therefore, Mg is likely to be quickly introduced into the first p-type semiconductor layer immediately after the start of the growth of the first p-type semiconductor layer. Therefore, the first p-type semiconductor layer grown has a high Mg concentration, and the Group III nitride semiconductor light-emitting device produced has a low driving voltage.

In a method for producing a Group III nitride semiconductor light-emitting device according to a second aspect, the step of forming the first p-type semiconductor layer includes the steps of forming a p-type cladding layer on the light-emitting layer; and forming a p-type intermediate layer on the p-type cladding layer. The step of forming the p-type cladding layer includes supplying the dopant gas without supplying the first raw material gas, and then supplying the first raw material gas and the dopant gas so as to grow the p-type cladding layer.

In a method for producing a Group III nitride semiconductor light-emitting device according to a third aspect, the step of forming the first p-type semiconductor layer includes the steps of forming a p-type cladding layer on the light-emitting layer; and forming a p-type intermediate layer on the p-type cladding layer. The step of forming the p-type intermediate layer includes supplying the dopant gas without supplying the first raw material gas, and then supplying the first raw material gas and the dopant gas so as to grow the p-type intermediate layer.

In a method for producing a Group III nitride semiconductor light-emitting device according to a fourth aspect, the step of forming the first p-type semiconductor layer includes the steps of forming a p-type cladding layer on the light-emitting layer; and forming a p-type intermediate layer on the p-type cladding layer. The step of forming the p-type cladding layer includes supplying the dopant gas without supplying the first raw material gas, and then supplying the first raw material gas and the dopant gas so as to grow the p-type cladding layer. The step of forming the p-type intermediate layer includes supplying the dopant gas without supplying the first raw material gas, and then supplying the first raw material gas and the dopant gas so as to grow the p-type intermediate layer.

In a method for producing a Group III nitride semiconductor light-emitting device according to a fifth aspect, the flow rate of the dopant gas in the first period is equal to or lower than the flow rate of the dopant gas in the second period. In this case, it is possible to dope the semiconductor layer with Mg at a desired constant concentration after increasing the Mg concentration somewhat steeply.

In a method for producing a Group III nitride semiconductor light-emitting device according to a sixth aspect, the flow rate of the dopant gas in the first period is higher than the flow rate of the dopant gas in the second period. This technique is suitable for the case where a semiconductor material into which Mg is not easily introduced is doped with Mg, the case where doping with Mg is performed under production conditions under which Mg is not easily introduced, or the case where doping with Mg is performed using an apparatus in which the supply amount of Mg cannot be controlled as intended. With this technique, a semiconductor layer can be doped with Mg at a desired constant concentration after a steep increase in the Mg concentration.

In a method for producing a Group III nitride semiconductor light-emitting device according to a seventh aspect, the flow rate of the dopant gas in the first period is increased with time.

In a method for producing a Group III nitride semiconductor light-emitting device according to an eighth aspect, a second raw material gas containing nitrogen atoms is supplied during the first period and the second period.

In a method for producing a Group III nitride semiconductor light-emitting device according to a ninth aspect, a second raw material gas containing nitrogen atoms is not supplied during the first period and is supplied during the second period.

In a method for producing a Group III nitride semiconductor light-emitting device according to a tenth aspect, the first period is 1 second or longer and 300 seconds or shorter.

The present specification provides a method for producing a Group III nitride semiconductor light-emitting device with a low driving voltage, which is realized by steeply increasing the concentration of Mg within a p-type semiconductor layer.

DETAILED DESCRIPTION OF PREFERRED EMBODIMENTS

Figure 1:
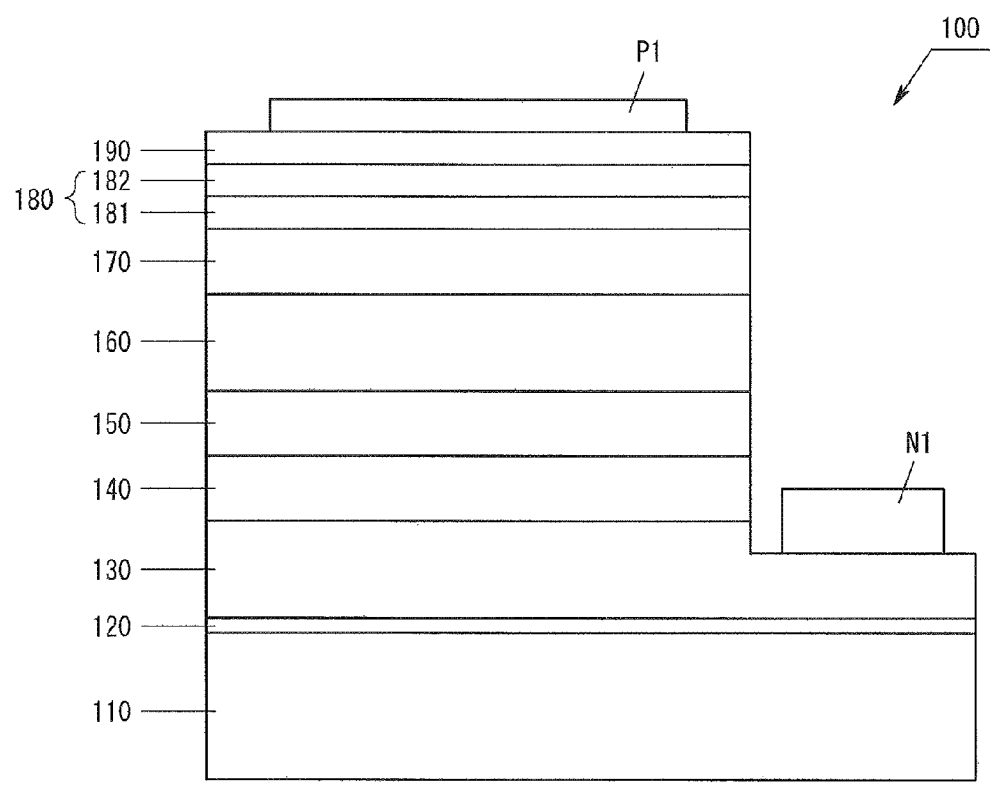
FIG. 1 is a schematic illustration showing the structure of a light-emitting device in an embodiment.

A specific exemplary embodiment of the method for producing a semiconductor light-emitting device will next be described with reference to the drawings. However, the technique of the present specification is not limited to the embodiment. The layered structure and electrode structure of the semiconductor light-emitting device described later are examples only. It will be appreciated that any layered structure different from that in the embodiment may be employed. The thicknesses of layers shown in the drawings are conceptual and are not their actual thicknesses.

1. Semiconductor Light-Emitting Device

FIG. 1 schematically shows the structure of a light-emitting device 100 according to the present embodiment. The light-emitting device 100 is a face-up type semiconductor light-emitting device. The light-emitting device 100 includes a plurality of semiconductor layers formed of Group III nitride semiconductors. As shown in FIG. 1, the light-emitting device 100 includes a substrate 110, a buffer layer 120, an n-type contact layer 130, an n-side high electrostatic breakdown voltage layer 140, an n-side superlattice layer 150, a light-emitting layer 160, a p-type cladding layer 170, a p-type intermediate layer 180, a p-type contact layer 190, a p-electrode P1, and an n-electrode N1.

The buffer layer 120, the n-type contact layer 130, the n-side high electrostatic breakdown voltage layer 140, the n-side superlattice layer 150, the light-emitting layer 160, the p-type cladding layer 170, the p-type intermediate layer 180, and the p-type contact layer 190 are formed in this order on a principal surface of the substrate 110. The n-electrode N1 is formed on the n-type contact layer 130. The p-electrode P1 is formed on the p-type contact layer 190. The n-type contact layer 130, the n-side high electrostatic breakdown voltage layer 140, and the n-side superlattice layer 150 are n-type semiconductor layers. The p-type cladding layer 170, the p-type intermediate layer 180, and the p-type contact layer 190 are p-type semiconductor layers. Each of these layers may partially include a non-doped layer. As described above, the light-emitting device 100 includes the n-type semiconductor layers, the light-emitting layer on the n-type semiconductor layers, the p-type semiconductor layers on the light-emitting layer, the p-electrode P1 on the p-type semiconductor layers, and the n-electrode N1 on the n-type semiconductor layers.

The substrate 110 is a growth substrate for forming, on its principal surface, the above-described semiconductor layers by MOCVD. Preferably, the principal surface is processed to have irregularities. The material of the substrate 110 is sapphire. Materials other than sapphire, such as SiC, ZnO, Si, GaN, and AlN, may be used.

The buffer layer 120 is formed on the principal surface of the substrate 110. The buffer layer 120 is used to form crystal nuclei on the substrate 110 at high density. This facilitates growth of a semiconductor crystal layer having a flat surface. The material of the buffer layer 120 is, for example, AlN, GaN, BN, or TiN.

The n-type contact layer 130 is in contact with the n-electrode N1. The n-type contact layer 130 is formed on the buffer layer 120. The n-type contact layer 130 is n-type GaN. The concentration of Si in the n-type contact layer 130 is $1\times10^{18}/cm^3$ or higher. The n-type contact layer 130 may include a plurality of layers with different carrier concentrations. The thickness of the n-type contact layer 130 is, for example, 1,000 nm to 10,000 nm. Of course, any other thickness may be used.

The n-side high electrostatic breakdown voltage layer 140 is provided to prevent electrostatic breakdown of the semiconductor layers. The n-side high electrostatic breakdown voltage layer 140 is formed on the n-type contact layer 130. The n-side high electrostatic breakdown voltage layer 140 is formed by depositing an i-GaN layer formed of non-doped i-GaN and an n-type GaN layer formed of Si-doped n-type GaN. The thickness of the i-GaN layer is, for example, 5 nm to 500 nm. The thickness of the n-type GaN layer is, for example, 10 nm to 50 nm. The concentration of Si in the n-type GaN layer is $1\times10^{18}/cm^3$ to $5\times10^{19}/cm^3$. These numerical ranges are examples only, and different numerical ranges may be used. An n-type GaN layer may be formed below the non-doped i-GaN layer.

The n-side superlattice layer 150 is a strain relaxation layer for relaxing stress applied to the light-emitting layer 160. More specifically, the n-side superlattice layer 150 has a superlattice structure. The n-side superlattice layer 150 is formed by repeatedly depositing an InGaN layer and an n-type GaN layer. The number of repetitions is 3 to 20. The number of repetitions may be any other number. The content of In in the InGaN layers in the n-side superlattice layer 150 is, for example, 2% to 20%. The thickness of the InGaN layers in the n-side superlattice layer 150 is, for example, 0.2 nm to 9 nm. The thickness of the n-type GaN layers in the n-side superlattice layer 150 is, for example, 1 nm to 5 nm. A GaN layer may be formed between an InGaN layer and an n-type GaN layer.

The light-emitting layer 160 emits light through recombination of electrons and holes. The light-emitting layer 160 is formed on the n-side superlattice layer 150. The light-emitting layer 160 includes at least a well layer and a barrier layer. The well layer may be, for example, an InGaN layer. The barrier layer may be, for example, a GaN layer or an AlGaN layer. These are examples only, and another layer such as an AlInGaN layer may be used. A GaN layer for protecting the InGaN layer may be formed on the InGaN layer. In this case, the light-emitting layer 160 is formed by repeatedly depositing an InGaN layer, a GaN layers, and an AlGaN layer.

The p-type cladding layer 170 is formed on the light-emitting layer 160. The p-type cladding layer 170 is a p-side superlattice layer. The p-type cladding layer 170 is, for example, a layered stack formed by repeatedly depositing a p-type AlGaN layer and a p-type InGaN layer. The number of repetitions is, for example, 5 to 20. The Al composition of each p-type AlGaN layer of the p-type cladding layer 170 is 5% to 40%. The thickness of each of the p-type AlGaN layers in the p-type cladding layer 170 is 0.5 nm to 7 nm. The content of In in the p-type InGaN layers in the p-type cladding layer 170 is 1% to 20%. The thickness of each of the p-type InGaN layers in the p-type cladding layer 170 is 0.5 nm to 7 nm.

The total thickness of the p-type cladding layer 170 is 2 nm to 50 nm. The concentration of Mg in the p-type cladding layer 170 is $5\times10^{19}/cm^3$ to $5\times10^{21}/cm^3$. The concentration of Mg is preferably $8\times10^{19}/cm^3$ to $1\times10^{21}/cm^3$, more preferably $1\times10^{20}/cm^3$ to $5\times10^{20}/cm^3$. These values are examples only. Therefore, other values may be used, and a different configuration may be used.

The p-type intermediate layer 180 is formed on the p-type cladding layer 170. The p-type intermediate layer 180 includes a GaN layer 181 and a p-type GaN layer 182. The GaN layer 181 is a first p-type intermediate layer. The p-type GaN layer 182 is a second p-type intermediate layer. The p-type GaN layer 182 is a layer formed of GaN doped with Mg. The GaN layer 181 is formed on the p-type cladding layer 170. The p-type GaN layer 182 is formed on the GaN layer 181. The p-type GaN layer 182 is in contact with the p-type contact layer 190.

The p-type contact layer 190 is a semiconductor layer electrically connected to the p-electrode P1. Therefore, the p-type contact layer 190 is in contact with the p-electrode P1. The p-type contact layer 190 is formed on the second p-type GaN layer 182 of the p-type intermediate layer 180. The p-type contact layer 190 is formed of p-type GaN doped with Mg.

The p-electrode P1 is formed on the p-type contact layer 190. The p-electrode P1 is in contact with the p-type contact layer 190. The material of the p-electrode P1 is ITO. A transparent conductive oxide other than ITO, such as ICO, IZO, ZnO, $TiO_2$, $NbTiO_2$, or $TaTiO_2$, can also be used. A metal electrode formed of a metal such as Ni, Au, Ag, Co, In, or Rh may be formed on the p-electrode P1. Alternatively, another electrode may be formed on the p-electrode P1.

The n-electrode N1 is formed on the n-type contact layer 130. The n-electrode N1 is in contact with the n-type contact layer 130. The n-electrode N1 is formed from V and Al that are stacked in this order on the n-type contact layer 130. Alternatively, Ti and Al may be stacked in this order. Alternatively, Ti and Au may be stacked in this order.

2. Method for Forming P-Type Cladding Layer

The step of forming the p-type cladding layer 170 will be described. This step is performed in an MOCVD furnace.

The same raw material gases may be used in all the following formation methods. The raw material gases include a first raw material gas, a second raw material gas, and a third raw material gas. The first raw material gas contains gallium (Ga) atoms. Specifically, the first raw material gas is a Group III element-containing raw material gas. Examples of the first raw material gas include trimethylgallium (TMG) and triethylgallium (TEG). The second raw material gas contains nitrogen (N) atoms. Examples of the second raw material gas include ammonia ($NH_3$) and hydrazine ($N_2H_4$). The third raw material gas is a dopant gas containing Mg atoms. Examples of the third raw material gas include cyclopentadienylmagnesium (Mg $(C_5H_5)_2$) and bisethylcyclopentadienylmagnesium (EtCp$_2$Mg:Mg $(C_2H_5C_5H_4)_2$).

2-1. First Formation Method

Figure 2:
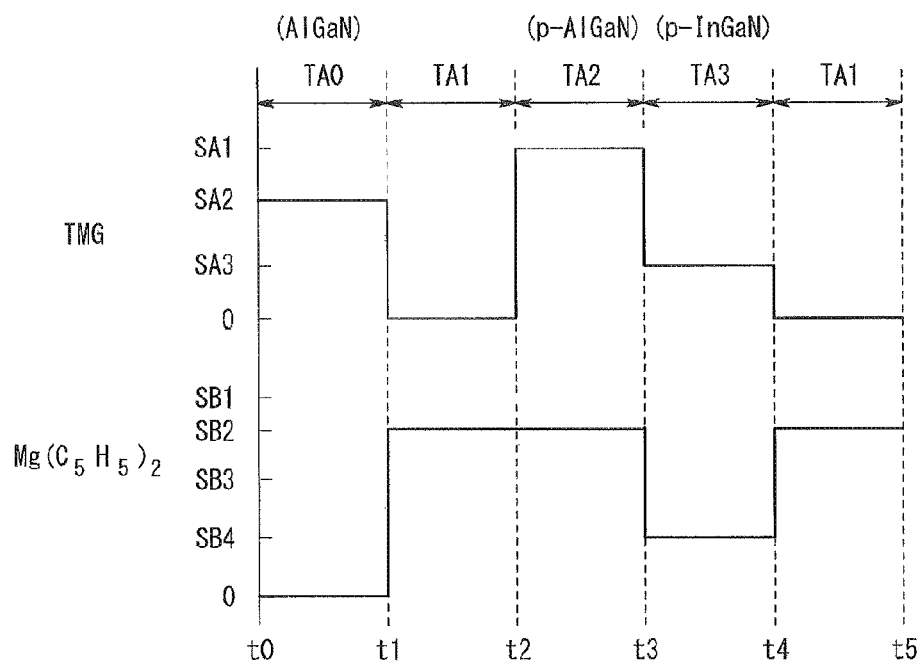
FIG. 2 is a timing chart for illustrating a first method for forming a p-type cladding layer of the light-emitting device in the embodiment.

FIG. 2 is a timing chart showing the amounts of raw material gases supplied in a p-type cladding layer formation step of a first formation method. In addition to the raw material gases shown in FIG. 2, the second raw material gas containing nitrogen atoms (e.g., ammonia) and a carrier gas such as nitrogen gas or hydrogen gas are used.

As shown in FIG. 2, the p-type cladding layer formation step includes a first period TA1, a second period TA2, and a third period TA3. The second period TA2 follows the first period TA1. The third period TA3 follows the second period TA2. A zeroth period TA0 in FIG. 2 is the final period of a light-emitting layer formation step. As shown in FIG. 2, the first period TA1 appears again after the third period TA3. The p-type cladding layer 170 is a layered stack formed by repeatedly depositing a p-type AlGaN layer and a p-type InGaN layer. Therefore, the first period TA1, the second period TA2, and the third period TA3 are repeated the number of times equal to the number of pairs of stacked layers. The second raw material gas containing nitrogen atoms is supplied over the first period TA1, the second period TA2, and the third period TA3.

In the first period TA1, the dopant gas is supplied while the Group III element-containing first raw material gas is not supplied. Specifically, while trimethylgallium (TMG) is not supplied to the substrate 110, the dopant gas ($Mg(C_5H_5)_2$) is supplied to the substrate 110 in an amount of SB2. In the first period TA1, other Group III metal-containing gases such as trimethylaluminum (TMA) are also not supplied. Specifically, in the first period TA1, the Group III metal-containing first raw material gas is not supplied to the substrate 110. Therefore, in the first period TA1, no semiconductor layer is grown. Instead, the MOCVD furnace is filled with the dopant gas containing Mg. The dopant gas is present in the vicinity of the surface of the substrate 110 at a certain concentration. Preferably, the first period TA1 is 1 second or longer and 300 seconds or shorter. The first period TA1 may be 1 second or longer and 150 seconds or shorter.

In the second period TA2, the Group III element-containing first raw material gas and the dopant gas are supplied to allow a semiconductor layer to grow. Specifically, trimethylgallium (TMG) is supplied in an amount of SA1, and the dopant gas is supplied in an amount of SB2. Another Group III metal-containing gas may be supplied. In this case, trimethylaluminum (TMA) is supplied. The amount of the dopant gas supplied in the second period TA2 is the same as the amount of the dopant gas supplied in the first period TA1. A p-type AlGaN layer is thereby formed.

At the start time t2 of the second period TA2, the vicinity of the surface of the substrate 110 is filled with the dopant gas at a sufficient concentration. Therefore, when the raw material gases reach the substrate 110 and the p-type AlGaN layer is thereby grown, this semiconductor layer is properly doped with the dopant gas.

In the third period TA3, trimethylgallium (TMG) is suppled in an amount of SA3, and the dopant gas is supplied in an amount of SB4. Trimethylindium (TMI) is also supplied. A p-type InGaN layer can thereby be grown. The supply amount SA1 of trimethylgallium (TMG) is larger than the supply amount SA2. The supply amount SA2 is larger than the supply amount SA3. The supply amount SB2 of the dopant gas ($Mg(C_5H_5)_2$) is larger than the supply amount SB4.

2-2. Second Formation Method

Figure 3:
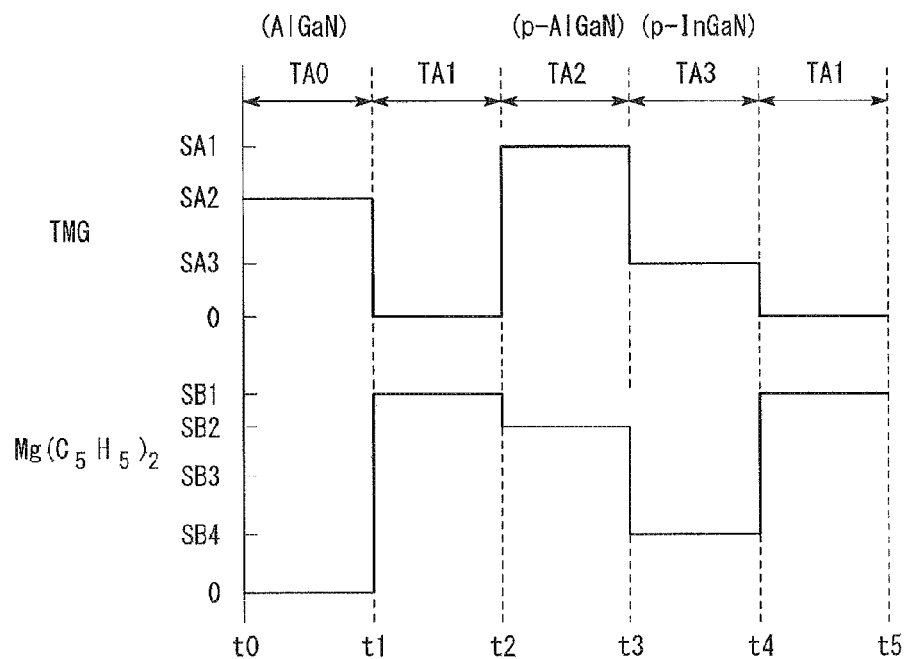
FIG. 3 is a timing chart for illustrating a second method for forming the p-type cladding layer of the light-emitting device in the embodiment.

FIG. 3 is a timing chart showing the amounts of raw material gases supplied in the p-type cladding layer formation step of a second formation method. In addition to the raw material gases shown in FIG. 3, the second raw material gas (e.g., ammonia) and a carrier gas such as nitrogen gas or hydrogen gas are used. The second period TA2 and third period TA3 in the second formation method are the same as those in the first formation method. Therefore, a description will be given of the first period TA1.

In the first period TA1, trimethylgallium (TMG) is not supplied, and the dopant gas ($Mg(C_5H_5)_2$) is supplied in an amount of SB1. The supply amount SB1 is larger than the supply amount SB2. In the first period TA1, other Group III metal-containing gases are also not supplied. Specifically, in the first period TA1, no Group III metals are supplied to the substrate 110. Therefore, in the first period TA1, no semiconductor layer is grown. Instead, the MOCVD furnace is filled with the dopant gas containing Mg. The dopant gas is present in the vicinity of the surface of the substrate 110 at a certain concentration.

2-3. Third Formation Method

Figure 4:
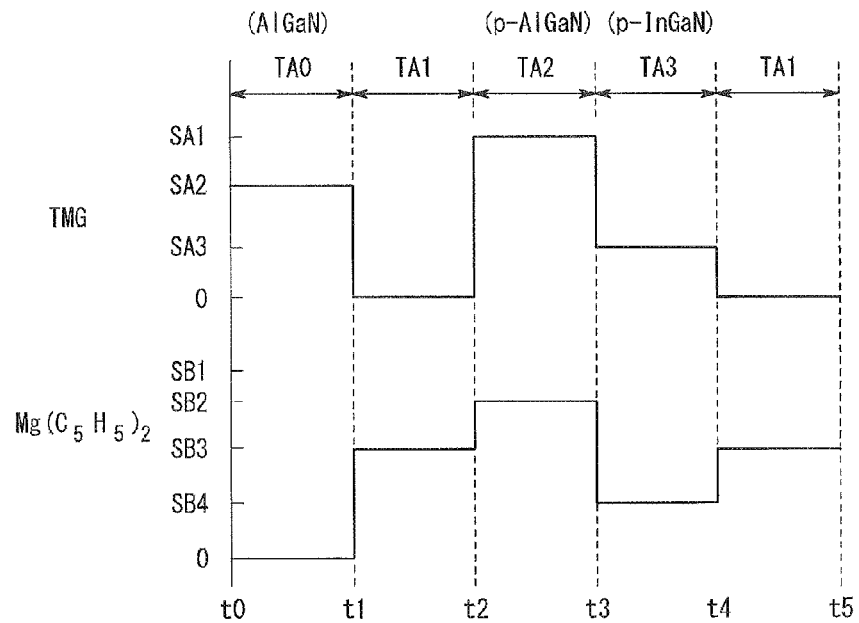
FIG. 4 is a timing chart for illustrating a third method for forming the p-type cladding layer of the light-emitting device in the embodiment.

FIG. 4 is a timing chart showing the amounts of raw material gases supplied in the p-type cladding layer formation step of a third formation method. In addition to the raw material gases shown in FIG. 4, the second raw material gas (e.g., ammonia) and a carrier gas such as nitrogen gas or hydrogen gas are used. The second period TA2 and third period TA3 in the third formation method are the same as those in the first formation method. Therefore, a description will be given of the first period TA1.

In the first period TA1, trimethylgallium (TMG) is not supplied, and the dopant gas ($Mg(C_5H_5)_2$) is supplied in an amount of SB3. The supply amount SB3 is lower than the supply amount SB2. In the first period TA1, other Group III metal-containing gases are also not supplied. Specifically, in the first period TA1, no Group III metals are supplied to the substrate 110. Therefore, in the first period TA1, no semiconductor layer is grown. Instead, the MOCVD furnace is filled with the dopant gas containing Mg. The dopant gas is present in the vicinity of the surface of the substrate 110 at a certain concentration.

2-4. Fourth Formation Method

Figure 5:
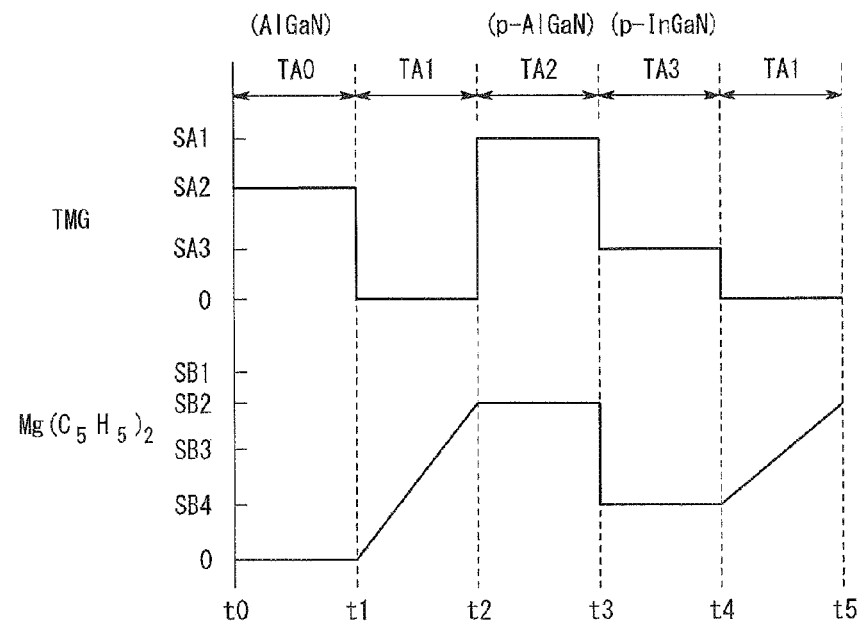
FIG. 5 is a timing chart for illustrating a fourth method for forming the p-type cladding layer of the light-emitting device in the embodiment.

FIG. 5 is a timing chart showing the amounts of raw material gases supplied in the p-type cladding layer formation step of a fourth formation method. In addition to the raw material gases shown in FIG. 5, the second raw material gas (e.g., ammonia) and a carrier gas such as nitrogen gas or hydrogen gas are used. The second period TA2 and third period TA3 in the fourth formation method are the same as those in the first formation method. Therefore, a description will be given of the first period TA1.

In the first period TA1, the flow rate of the dopant gas is increased with time. Specifically, with no trimethylgallium (TMG) supplied, the supply amount of the dopant gas ($Mg(C_5H_5)_2$) is increased gradually from 0 to SB2. In the first period TA1, other Group III metal-containing gases are also not supplied. Specifically, in the first period TA1, no Group III metals are supplied to the substrate 110. Therefore, in the first period TA1, no semiconductor layer is grown. Instead, the MOCVD furnace is filled with the dopant gas containing Mg. The dopant gas is present in the vicinity of the surface of the substrate 110 at a certain concentration.

2-5. Flow Rate of Dopant Gas

As described above, in the first, third, and fourth formation methods, the flow rate of the dopant gas in the first period TA1 is equal to or lower than the flow rate of the dopant gas in the second period TA2. In the second formation method, the flow rate of the dopant gas in the first period TA1 is larger than the flow rate of the dopant gas in the second period TA2.

2-6. Effects of P-Type Cladding Layer Formation Methods

As described above, in the present embodiment, the dopant gas containing Mg is supplied to the substrate 110 prior to the supply of the Group III metal-containing organic metal gases. Therefore, at time t2 at which the Group III metal-containing first raw material gas reaches the substrate 110 to form the p-type cladding layer 170, the vicinity of the surface of the substrate 110 is sufficiently filled with the dopant gas. In this case, the p-type cladding layer 170 is quickly doped with Mg.

Figure 6:
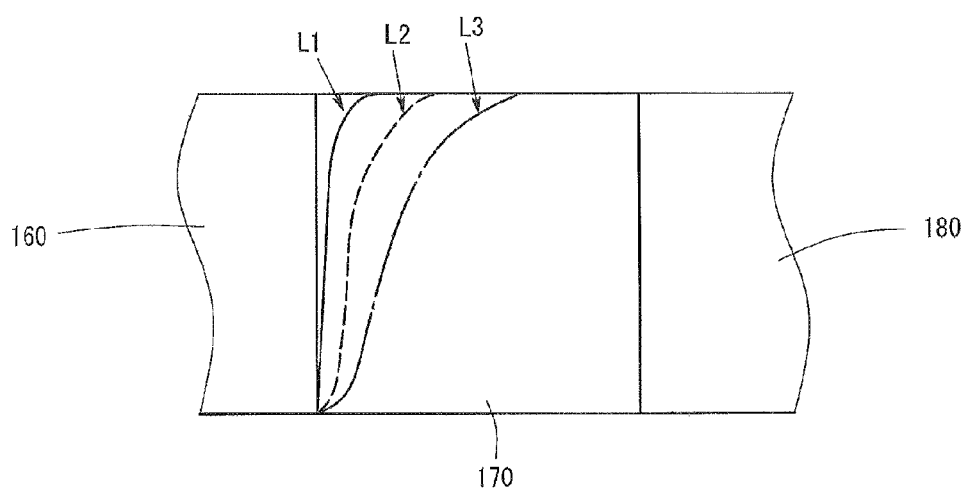
FIG. 6 is a conceptual illustration showing the relation between the position in the p-type cladding layer and the concentration of Mg.

FIG. 6 is a conceptual illustration showing the relation between the p-type cladding layer 170 and the concentration of Mg. The horizontal direction in FIG. 6 represents the position in the depositing structure of the light-emitting device 100. The vertical direction in FIG. 6 schematically represents the Mg concentration in the depositing structure. Line L1 in FIG. 6 represents a change in the Mg concentration when the method for forming the p-type cladding layer 170 in the present embodiment was used. Line L2 in FIG. 6 is a line (No. 1) representing a change in the Mg concentration when a conventional p-type cladding layer formation method was used. Line L3 in FIG. 6 is a line (No. 2) representing a change in the Mg concentration when a conventional p-type cladding layer formation method was used.

As shown by line L1 in FIG. 6, with the method for forming the p-type cladding layer 170 in the present embodiment, the Mg concentration increases steeply, and the Mg concentration is high in the vicinity of the boundary between the p-type cladding layer 170 and the light-emitting layer 160. Therefore, in the above light-emitting device 100, the driving voltage Vf tends to be sufficiently low.

Meanwhile, as shown by line L2 in FIG. 6, with the conventional technique, the Mg concentration increases less steeply than in the present embodiment. Therefore, the driving voltage Vf of the conventional light-emitting device tends to be higher than the driving voltage Vf of the light-emitting device 100 in the present embodiment. With the conventional technique, Mg is not stably introduced into semiconductor layers. Therefore, the Mg concentration may vary among production lots, as shown by lines L2 and L3. In other words, the driving voltage Vf varies among production lots. The technique of the present embodiment can reduce a variation in the Mg concentration among production lots and allows the Mg concentration to increase steeply within the p-type cladding layer 170.

Since the Mg concentration in the vicinity of the boundary between the light-emitting layer 160 and the p-type cladding layer 170 is high as described above, electrons can be suitably confined. In other words, the light-emitting device 100 produced has high brightness. The formation of the p-type cladding layer 170 having a high Mg concentration can reduce series resistance. Therefore, the light-emitting device 100 produced has a low driving voltage Vf. In addition, the Mg concentration hardly varies among production lots. Therefore, the yield of the light-emitting device 100 is improved.

3. Method for Producing Semiconductor Light-Emitting Device

A description will next be given of a method for producing the light-emitting device 100 according to the present embodiment. In the present embodiment, crystals forming the semiconductor layers are formed by epitaxial growth using metal organic chemical vapor deposition (MOCVD). Therefore, this production method includes an n-type semiconductor layer formation step of forming the n-type semiconductor layers on the substrate, a light-emitting layer formation step of forming the light-emitting layer on the n-type semiconductor layers, a first p-type semiconductor layer formation step of forming a first p-type semiconductor layer on the light-emitting layer, a p-type contact layer formation step of forming the p-type contact layer on the first p-type semiconductor layer, a p-electrode formation step of forming the p-electrode on the p-type contact layer, and an n-electrode formation step of forming the n-electrode on the n-type semiconductor layer. The first p-type semiconductor layer is a p-type semiconductor layer other than the p-type contact layer. In the present embodiment, the first p-type semiconductor layer includes the p-type cladding layer 170 and the p-type intermediate layer 180.

The carrier gas used is hydrogen ($H_2$), nitrogen ($N_2$), or a gas mixture of hydrogen and nitrogen ($H_2+N_2$). Any of these may be used in the steps described later, unless otherwise specified. Ammonia gas ($NH_3$) is used as a nitrogen source. Trimethylgallium ($Ga(CH_3)_3$:"TMG") is used as a Ga source. Trimethylindium ($In(CH_3)_3$:"TMI") is used as an In source. Trimethylaluminum ($Al(CH_3)_3$:"TMA") is used as an Al source. Silane ($SiH_4$) is used as an n-type dopant gas. Cyclopentadienylmagnesium ($Mg(C_5H_5)_2$, hereinafter may be referred to as "Cp2Mg") is used as the p-type dopant gas.

3-1. N-Type Semiconductor Layer Formation Step 3-1-1. N-Type Contact Layer Formation Step First, the substrate 110 is cleaned with hydrogen gas. Next, the buffer layer 120 is formed on a principal surface of the substrate 110. Then the n-type contact layer 130 is formed on the buffer layer 120. The temperature of the substrate in this process is 1,000° C. to 1,200° C.

3-1-2. N-Side Nigh Electrostatic Breakdown Voltage Layer Formation Step

Next, the n-side high electrostatic breakdown voltage layer 140 is formed on the n-type contact layer 130. To form the i-GaN layer, the supply of silane ($SiH_4$) is stopped. The temperature of the substrate in this process is 750° C. to 950° C. Then silane ($SiH_4$) is again supplied in order to form n-type GaN. The temperature of the substrate in this process is the same as the temperature during the formation of the i-GaN layer, i.e., 750° C. to 950° C.

3-1-3. N-Side Superlattice Layer Formation Step

Next, the n-side superlattice layer 150 is formed on the n-side high electrostatic breakdown voltage layer 140. For example, an InGaN layer and an n-type GaN layer are repeatedly deposited. The temperature of the substrate in this process is 700° C. to 950° C.

3-2. Light-Emitting Layer Formation Step

Next, the light-emitting layer 160 is formed on the n-side superlattice layer 150. For example, an InGaN layer, a GaN layer, and an AlGaN layer are repeatedly deposited. The temperature of the substrate in this process is, for example, 700° C. to 900° C.

3-3. P-Type Semiconductor Layer Formation Step 3-3-1. P-Type Cladding Layer Formation Step (First P-Type Semiconductor Layer Formation Step (No. 1))

Next, the p-type cladding layer 170 is formed on the light-emitting layer 160. For example, a p-type AlGaN layer and a p-type InGaN layer are repeatedly deposited. The dopant gas used may be cyclopentadienylmagnesium ($Mg(C_5H_5)_2$). In this step, any of the first to fourth formation methods described above may be used.

Figure 7:
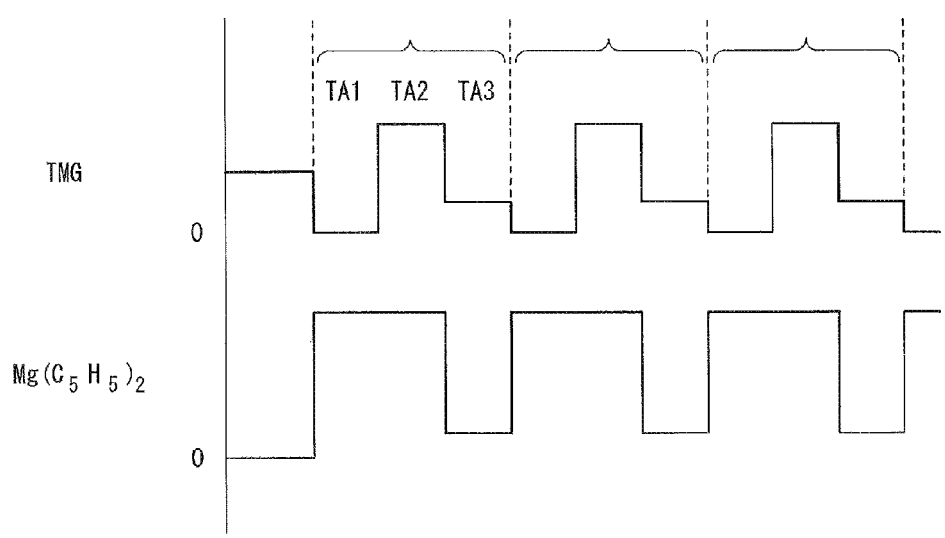
FIG. 7 is a timing chart showing the state of supply of raw material gases during the formation of the p-type cladding layer of the light-emitting device in the embodiment.

Specifically, in the first period TA1, while the Group III element-containing first raw material gas is not supplied, the dopant gas is supplied. In the second period TA2, the Group III element-containing first raw material gas and the dopant gas are supplied to allow the p-type cladding layer 170 to grow. In practice, as shown in FIG. 7, the first period TA1 to the third period TA3 are periodically repeated the number of times equal to the number of pairs of stacked layers. The temperature of the substrate is 800° C. to 1,200° C.

When the p-type cladding layer 170 is formed, the carrier gas supplied is nitrogen gas, hydrogen gas, or a gas mixture thereof. When a gas mixture of $H_2$ and $N_2$, for example, is used, the molar ratio of nitrogen gas in the carrier gas is 20% to 80%. The molar ratio is preferably 30% to 80%, more preferably 40% to 70%.

Hydrogen gas facilitates migration of the constituent atoms of the p-type cladding layer 170. Therefore, the surface flatness of this layer is improved. However, hydrogen atoms may be captured in the crystals forming the layer and bonded to Mg. In this case, activation of Mg is inhibited. Nitrogen gas inhibits decomposition of the crystals. Specifically, the nitrogen gas can prevent undesired release of nitrogen atoms from the crystals.

3-3-2. P-Type Intermediate Layer Formation Step (First P-Type Semiconductor Layer Formation Step (No. 2))

Next, the p-type intermediate layer 180 is formed on the p-type cladding layer 170. Specifically, the GaN layer 181 is formed on the p-type cladding layer 170. When the GaN layer 181 is formed, the p-type dopant gas is not supplied. However, the GaN layer 181 may be doped with Mg because of the memory effect of the dopant gas used in the p-type cladding layer formation step. Then the p-type GaN layer 182 is formed on the GaN layer 181. When the p-type GaN layer 182 is formed, the p-type dopant gas is supplied.

3-3-3. P-Type Contact Layer Formation Step

Figure 8:
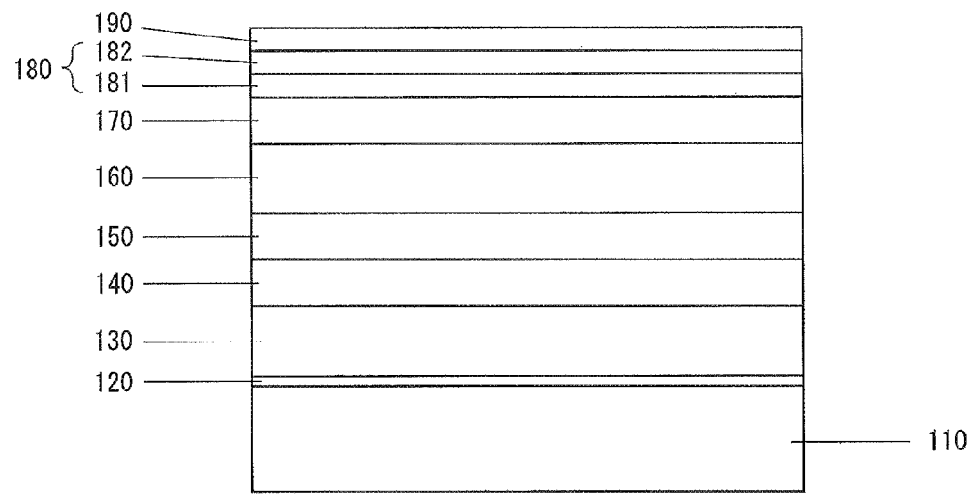
FIG. 8 is an illustration (No. 1) for describing a method for producing the light-emitting device in the embodiment.

Next, the p-type contact layer 190 is formed on the p-type intermediate layer 180. At least hydrogen gas is supplied as the carrier gas. The hydrogen gas can improve the surface flatness of the p-type contact layer 190. The temperature of the substrate is set to 800° C. to 1,200° C. Through the steps described above, the semiconductor layers are deposited on the substrate 110, as shown in FIG. 8.

3-4. Electrode Formation Step

Figure 9:
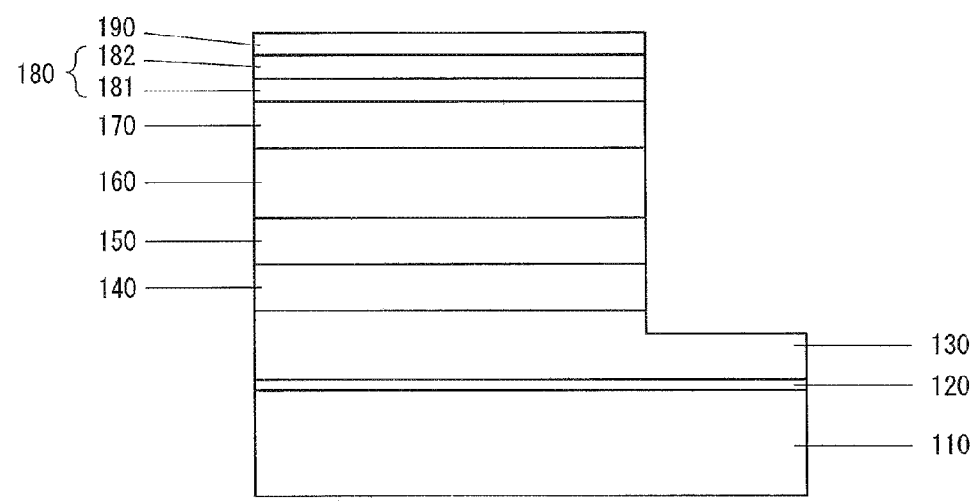
FIG. 9 is an illustration (No. 2) for describing the method for producing the light-emitting device in the embodiment.

Next, the p-electrode P1 is formed on the p-type contact layer 190. Then, as shown in FIG. 9, part of the semiconductor layers are removed from the p-type contact layer 190 side using a laser or by etching to expose the n-type contact layer 130. Then the n-electrode N1 is formed on the exposed portion of the n-type contact layer 130. The step of forming the p-electrode P1 may be performed before the step of forming the n-electrode N1, or the step of forming the n-electrode N1 may be performed before the step of forming the p-electrode P1.

3-5. Other Steps

In addition to the steps described above, other steps such as the step of covering the device with an insulating film and a heat treatment step may be performed. Through the steps described above, the light-emitting device 100 shown in FIG. 1 is produced.

4. Experiments

4-1. Experiment 1 (P-Type Cladding Layer)

A sample including a p-type cladding layer 170 grown using the first formation method was produced (Example 1). A sample including a p-type cladding layer formed using a conventional technique was also produced (Comparative Example 1). Production steps other than the p-type cladding layer formation step were the same for these samples. Then these samples were compared with each other in terms of their driving voltage.

The results are shown in Table 1. The driving voltage of Example 1 was 2.857 (V). The driving voltage of Comparative Example 1 was 2.863 (V). The driving voltage of Example 1 was lower by 0.006 (V) than the driving voltage of Comparative Example 1.

TABLE 1

|  | DRIVING VOLTAGE (Vf) |
| --- | --- |
| EXAMPLE 1 | 2.857 (V) |
| COMPARATIVE EXAMPLE 1 | 2.863 (V) |

Figure 10:
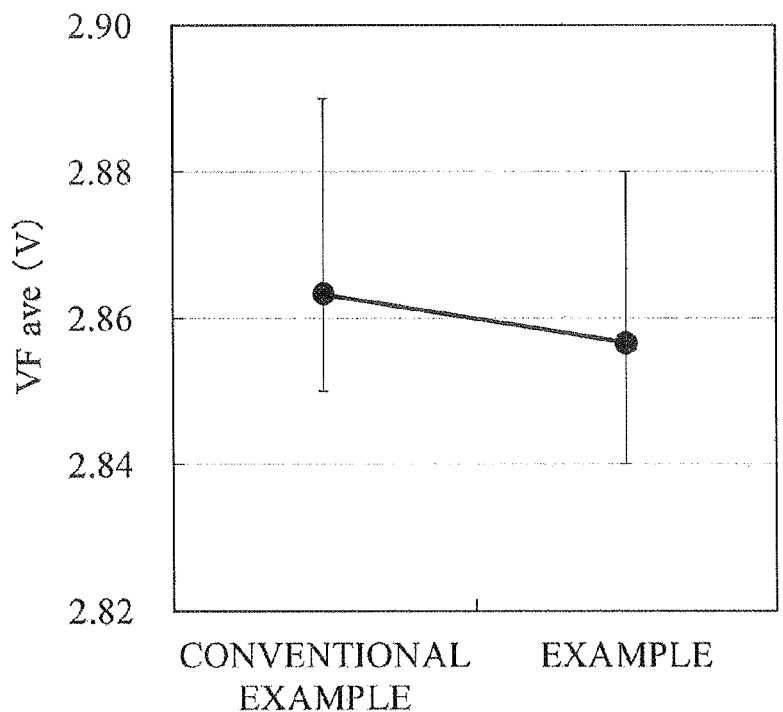
FIG. 10 is a graph comparing the driving voltage of a light-emitting device including a p-type cladding layer to which the technique of the embodiment is applied and the driving voltage of a light-emitting device produced by a conventional method.

FIG. 10 is a graph showing the results in Table 1.

4-2. Experiment 2 (P-Type Intermediate Layer)

A sample including a p-type intermediate layer 180 grown using the first formation method was produced (Example 2). A sample including a p-type intermediate layer formed using a conventional technique was also produced (Comparative Example 2). Production steps other than the p-type intermediate layer formation step were the same for these samples. These samples were compared with each other in terms of their driving voltage.

The results are shown in Table 2. The driving voltage of Example 2 was 2.857 (V). The driving voltage of Comparative Example 2 was 2.880 (V). The driving voltage of Example 2 was lower by 0.023 (V) than the driving voltage of Comparative Example 2.

TABLE 2

|  | DRIVING VOLTAGE (Vf) |
| --- | --- |
| Example 2 | 2.857 (V) |
| Comparative Example 2 | 2.880 (V) |

Figure 11:
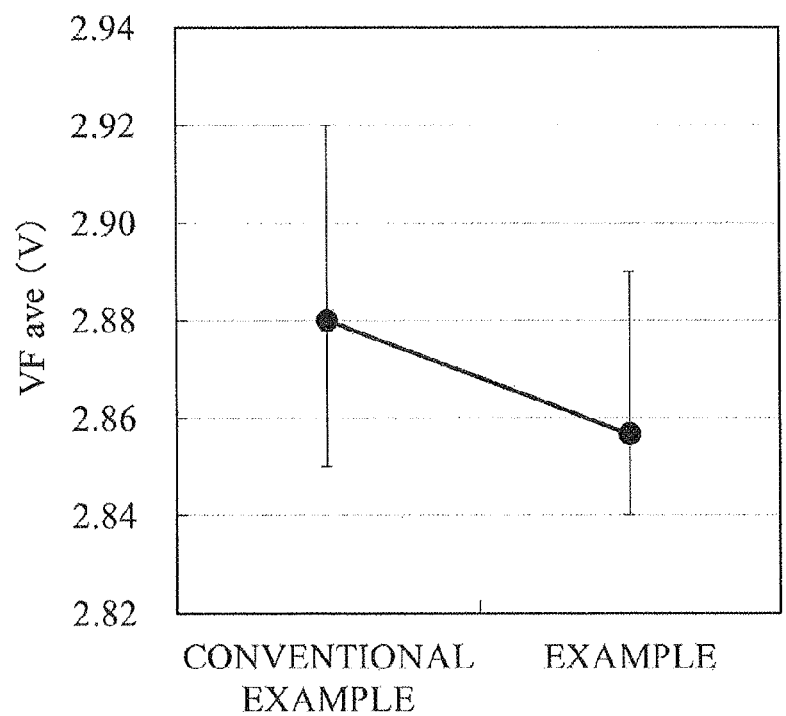
FIG. 11 is a graph comparing the driving voltage of a light-emitting device including a p-type intermediate layer to which the technique of the embodiment is applied and the driving voltage of a light-emitting device produced by a conventional method.

FIG. 11 is a graph showing the results in Table 2.

Figure 12:
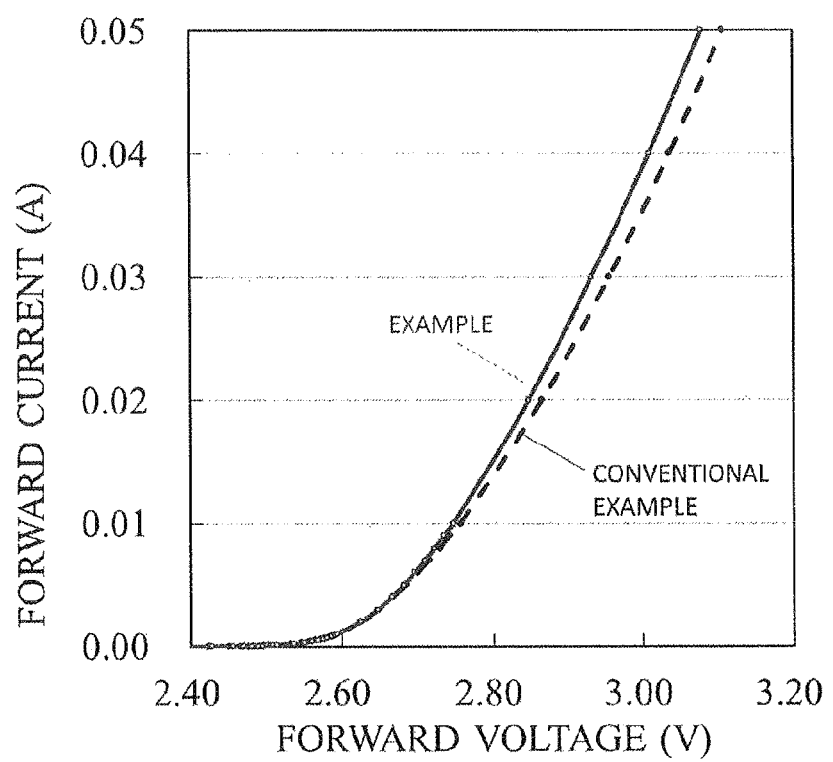
FIG. 12 is a graph showing the relation between forward voltage and forward current.

FIG. 12 is a graph for comparison of the light-emitting devices in terms of their forward voltage (V) and forward current (A). As shown in FIG. 12, when the same voltage was applied to the light-emitting device of the Example and the light-emitting device of the Comparative Example, the forward current of the light-emitting device of the Example was larger than the forward current of the light-emitting device of the Comparative Example.

It was therefore found that the driving voltage of the light-emitting device 100 of the present embodiment was lower than the driving voltage of the conventional light-emitting device.

5. Modifications

5-1. Application to P-Type Intermediate Layer

In the present embodiment, the first to fourth formation methods are applied to the p-type cladding layer 170. However, the technique of the present embodiment may be applied to the p-type intermediate layer 180. Specifically, in the first period TA1, the dopant gas is supplied while the Group III element-containing first raw material gas is not supplied. In the second period TA2, the Group III element-containing first raw material gas and the dopant gas are supplied to grow the p-type intermediate layer 180. In this case, the Mg concentration can be increased at a position spaced apart from the light-emitting layer 160. Therefore, the light-emitting device produced has a low driving voltage. The technique of the present embodiment may be applied to any p-type semiconductor layer other than the p-type contact layer.

5-2. Raw Material Gas Containing Nitrogen Atoms

In the present embodiment, the supply of the Group III metal-containing organic metal gases is stopped during the first period TA1. In the first period TA1, no semiconductor layer is grown. Therefore, in the first period TA1, the supply of the second raw material gas containing nitrogen atoms may be stopped. However, even when the second raw material gas containing nitrogen atoms is not supplied in the first period TA1, the second raw material gas may be supplied in the second period TA2.

5-3. Substrate Temperature

In the present embodiment, the substrate temperature is maintained constant during the p-type cladding layer formation step. However, the substrate temperature may be increased in the middle of the p-type cladding layer formation step. For example, the substrate temperature may be increased in the middle of the second period TA2. In this case, Mg is easily introduced into the p-type cladding layer 170. However, the substrate temperature is preferably 800° C. to 1,200° C.

5-4. Flip-Chip Type and Substrate Lift-Off Type

The technique of the present embodiment is applied to the face-up type light-emitting device 100. However, the technique is, of course, applicable to other semiconductor light-emitting devices. The technique is, of course, applicable to, for example, a flip-chip type semiconductor light-emitting device having a light extraction surface on its substrate side and a lift-off type semiconductor light-emitting device with the growth substrate removed.

5-5. Structure of P-Type Cladding Layer

In the present embodiment, the p-type cladding layer 170 is produced by stacking p-type AlGaN layers and p-type InGaN layers alternately. However, for example, a non-doped AlGaN layer may be provided on the light-emitting layer 160 side. Even in this case, the technique of the present embodiment may be applied when the p-type semiconductor layers are grown. The p-type semiconductor layer closest to the light-emitting layer 160 may not be a p-type AlGaN layer. Even in this case, the technique of the present embodiment can be applied when the p-type semiconductor layer closest to the light-emitting layer 160 is grown.

5-6. Application to First Half of P-Type Cladding Layer Formation Step

The technique of the present embodiment may be applied to the beginning of the formation of the p-type cladding layer 170. As the increase in Mg concentration in the p-type cladding layer 170 becomes steeper, electrons can be confined more preferably. Therefore, the technique of the present embodiment may be applied to the p-type semiconductor layer closest to the light-emitting layer 160 or to the p-type semiconductor layer second closest or third closest to the light-emitting layer 160.

5-7. Application to Second Half of P-Type Cladding Layer Formation Step

The technique of the present embodiment may be applied to the second half of the formation of the p-type cladding layer 170. In this case, the concentration of Mg in the p-type cladding layer 170 increases gently. This can prevent Mg in the p-type cladding layer 170 from diffusing into the light-emitting layer 160. Namely, a reduction in the light emission efficiency of the light-emitting device 100 can be prevented.

5-8. P-Type Intermediate Layer

In the present embodiment, the p-type intermediate layer 180 includes two layers, i.e., the GaN layer 181 and the p-type GaN layer 182 stacked thereon. However, the p-type intermediate layer may include only one layer and may include three or more layers. A Group III nitride semiconductor other than GaN may be used.

5-9. Combination

The above-described modifications may be combined appropriately.

6. Summary of Present Embodiment

As described above in detail, in the present embodiment, the dopant gas containing Mg is supplied to the substrate 110 prior to the supply of the Group III metal-containing organic metal gases. Therefore, at time t2 at which the Group III metal-containing first raw material gas reaches the substrate 110 to form the p-type cladding layer 170, the vicinity of the surface of the substrate 110 is sufficiently filled with the dopant gas. In this case, the p-type cladding layer 170 is quickly doped with Mg. Therefore, the Mg concentration increases quickly immediately after the start of the formation of the p-type cladding layer 170. Since the Mg concentration is high in the vicinity of the boundary between the light-emitting layer 160 and the p-type cladding layer 170, electrons can be properly confined. In other words, the light-emitting device 100 produced has high brightness. The formation of the p-type cladding layer 170 having a high Mg concentration can reduce series resistance. Therefore, the light-emitting device 100 produced has a low driving voltage Vf. In addition, the Mg concentration hardly varies among production lots. Therefore, the yield of the light-emitting device 100 is improved.

The semiconductor light-emitting device production method of the present embodiment has the second period TA2. The concentration of Mg in the p-type cladding layer 170 can be easily controlled by adjusting the length of time of the second period TA2 or the supply amounts of the raw material gases during this time period.

The above-described embodiment is merely an example. Accordingly, needless to say, the embodiment may be improved or modified in various ways without departing from the scope of the present techniques. The depositing structure of the layered stack is not necessarily limited to the above-illustrated structure. The depositing structure, the number of repetitions of layers, etc. may be freely selected. The vapor deposition method is not limited to the metal organic chemical vapor deposition (MOCVD) method. Any other vapor deposition method may be used so long as it uses a carrier gas to grow crystals.

What is claimed is:

1. A method for producing a Group III nitride semiconductor light-emitting device, the method comprising:
    forming an n-type semiconductor layer on a substrate;
    forming a light-emitting layer on the n-type semiconductor layer;
    forming a first p-type semiconductor layer on the light-emitting layer; and
    forming a p-type contact layer on the first p-type semiconductor layer,
    wherein the forming the first p-type semiconductor layer includes supplying a dopant gas during a first period without supplying a first raw material gas containing a Group III element, and supplying the first raw material gas and the dopant gas during a second period after the first period so as to grow a semiconductor layer.

2. The method for producing a Group III nitride semiconductor light-emitting device according to claim 1, wherein the forming the first p-type semiconductor layer includes:
    forming a p-type cladding layer on the light-emitting layer; and
    forming a p-type intermediate layer on the p-type cladding layer,
    wherein the forming the p-type cladding layer includes supplying the dopant gas without supplying the first raw material gas, and then supplying the first raw material gas and the dopant gas so as to grow the p-type cladding layer.

3. The method for producing a Group III nitride semiconductor light-emitting device according to claim 1, wherein the forming the first p-type semiconductor layer includes:
    forming a p-type cladding layer on the light-emitting layer; and
    forming a p-type intermediate layer on the p-type cladding layer,
    wherein the forming the p-type intermediate layer includes supplying the dopant gas without supplying the first raw material gas, and then supplying the first raw material gas and the dopant gas so as to grow the p-type intermediate layer.

4. The method for producing a Group III nitride semiconductor light-emitting device according to claim 1, wherein the forming the first p-type semiconductor layer includes:

forming a p-type cladding layer on the light-emitting layer; and forming a p-type intermediate layer on the p-type cladding layer, wherein the forming the p-type cladding layer includes supplying the dopant gas without supplying the first raw material gas, and then supplying the first raw material gas and the dopant gas so as to grow the p-type cladding layer, and the forming the p-type intermediate layer includes supplying the dopant gas without supplying the first raw material gas, and then supplying the first raw material gas and the dopant gas so as to grow the p-type intermediate layer.

5. The method for producing a Group III nitride semiconductor light-emitting device according to claim 1, wherein the flow rate of the dopant gas in the first period is equal to or lower than the flow rate of the dopant gas in the second period.

6. The method for producing a Group III nitride semiconductor light-emitting device according to claim 2, wherein the flow rate of the dopant gas in the first period is equal to or lower than the flow rate of the dopant gas in the second period.

7. The method for producing a Group III nitride semiconductor light-emitting device according to claim 3, wherein the flow rate of the dopant gas in the first period is equal to or lower than the flow rate of the dopant gas in the second period.

8. The method for producing a Group III nitride semiconductor light-emitting device according to claim 4, wherein the flow rate of the dopant gas in the first period is equal to or lower than the flow rate of the dopant gas in the second period.

9. The method for producing a Group III nitride semiconductor light-emitting device according to claim 1, wherein the flow rate of the dopant gas in the first period is higher than the flow rate of the dopant gas in the second period.

10. The method for producing a Group III nitride semiconductor light-emitting device according to claim 2, wherein the flow rate of the dopant gas in the first period is higher than the flow rate of the dopant gas in the second period.

11. The method for producing a Group III nitride semiconductor light-emitting device according to claim 3, wherein the flow rate of the dopant gas in the first period is higher than the flow rate of the dopant gas in the second period.

12. The method for producing a Group III nitride semiconductor light-emitting device according to claim 4, wherein the flow rate of the dopant gas in the first period is higher than the flow rate of the dopant gas in the second period.

13. The method for producing a Group III nitride semiconductor light-emitting device according to claim 1, wherein the flow rate of the dopant gas in the first period is increased with time.

14. The method for producing a Group III nitride semiconductor light-emitting device according to claim 1, wherein a second raw material gas containing nitrogen atoms is supplied during the first period and the second period.

15. The method for producing a Group III nitride semiconductor light-emitting device according to claim 1, wherein a second raw material gas containing nitrogen atoms is not supplied during the first period and is supplied during the second period.

16. The method for producing a Group III nitride semiconductor light-emitting device according to claim 1, wherein the first period is 1 second or longer and 300 seconds or shorter.

* * * * *